(12) United States Patent
Hurich et al.

(10) Patent No.: US 6,546,455 B1
(45) Date of Patent: Apr. 8, 2003

(54) METHOD AND DEVICE FOR MODIFYING THE MEMORY CONTENTS OF CONTROL EQUIPMENT

(75) Inventors: Martin Hurich, Vaihingen (DE); Robert Seyfang, Freiberg (DE); Eberhard Tenbusch, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 148 days.

(21) Appl. No.: 09/611,866

(22) Filed: Jul. 7, 2000

(30) Foreign Application Priority Data

Jul. 7, 1999  (DE) .......................................... 199 31 184

(51) Int. Cl.[7] .............................................. G06F 13/00
(52) U.S. Cl. ........................ 711/103; 711/100; 365/222
(58) Field of Search ................................. 711/100, 103, 711/154; 365/222, 189.05

(56) References Cited

U.S. PATENT DOCUMENTS

| | | | | |
|---|---|---|---|---|
| 4,517,663 A | * | 5/1985 | Imazeki et al. ............. | 365/222 |
| 5,802,551 A | * | 9/1998 | Komatsu et al. ............ | 711/103 |
| 5,878,256 A | * | 3/1999 | Bealkowski et al. ........ | 395/712 |
| 5,964,813 A | * | 10/1999 | Ishii et al. .................... | 701/35 |
| 5,978,808 A | * | 11/1999 | Wells et al. ................. | 707/100 |
| 6,125,424 A | * | 9/2000 | Komatsu et al. ............ | 711/103 |

FOREIGN PATENT DOCUMENTS

| | | |
|---|---|---|
| DE | 43 32 499 | 3/1995 |
| DE | 692 21 475 | 3/1998 |

* cited by examiner

*Primary Examiner*—Tuan V. Thai
(74) *Attorney, Agent, or Firm*—Kenyon & Kenyon (57) ABSTRACT

A method and a device for modifying data and programs and for writing the data and programs into at least one first non-volatile memory of a computer system, in particular a memory of a control unit of a vehicle. In this context, the data and programs are divided into at least first and second data and programs, at least the second data and programs being worthy of backup, or containing backup-worthy data and programs. However, the old second data and programs in the assigned original sector are not erased until new second data and programs are written into a second memory sector not corresponding to the original sector, and a copying program is written into a second volatile memory. The copying program writes the new second data and programs from the second memory sector into the original sector. As a result, there is no need to create a backup copy of the backup-worthy data and programs. Thus, the old second data and programs are not erased by an erase command sent by a programming unit, and they then assume execution of the sequencing control.

18 Claims, 4 Drawing Sheets

METHOD AND DEVICE FOR MODIFYING THE MEMORY CONTENTS OF CONTROL EQUIPMENT

FIELD OF THE INVENTION

The present invention relates to a control unit for controlling operational sequences in a vehicle.

BACKGROUND INFORMATION

German Published Patent Application No. 43 32 499 describes a method for completely reprogramming an electrically erasable, non-volatile memory in a control unit, particularly in a motor-vehicle control unit. Its programming operation is performed without the use of an permanent memory (ROM). In this instance, the erasable, non-volatile memory is divided into at least two separately erasable and programmable sectors, into each of which a programming module can be written in. The division into two sectors enables the entire programming operation to be repeated, in the event a power failure occurs before the programming operation is executed between the motor vehicle and the data terminal. This is possible because the programming module is present, quasi in duplicate, in the programmable, non-volatile memory, thus in each of the two memory sectors. Therefore, even if one of these two programming modules is erased, there is still an intact programming module in the memory as a backup copy. Backup copies must also be continually stored, since a disturbance, such as a power failure, entails a complete reprogramming. Such a reprogramming does not follow automatically, but must be specified externally.

It is apparent that the methods discussed here are not able to provide optimal results in every respect. Thus, sectors rendered incomplete because of a disturbance are not automatically restored. Restoration requires complete, external reprogramming. Therefore, the methods mentioned here require continually storing backup copies of the data and programs in a backup sector. Data and/or programs, worthy of back-up, are duplicated by backups, thus by backup copies, which must be executable. The result is a plurality of erase and programming cycles, which stresses the component containing the memory. The related art, as a rule, requires a multiplicity of steps or commands to reprogram a memory. The result is a relatively long programming code that is not executable, particularly during the copying phases of the backup.

If the copying routine is abnormally terminated during reprogramming, a backup containing the old data and/or programs or routines is then used. Since the backup used in this context includes all data and/or programs worthy of back-up, the code that must be executed in the event of an abnormal termination is relatively large. For that reason, depending on the size of the sector of the data and/or programs worthy of backup, known methods heretofore require a relatively large working man memory (RAM), for example, to execute the programming routine of this backup-worthy sector. Additional sources of error arise when a modifiable block of memory, containing the computer system's start programs ("boot block"), is used in this context as a programming environment which decides whether the old or new data sector and/or programming sector are executed at the moment.

Before a program or its backup copy is executed, a test can be performed to check for any existing data errors in the programming code. Many varied methods are known for identifying data errors, for example in the case of faulty memory or programming operations. For this, the data and/or programs must be represented in an error code, i.e., an error detection code, which, in addition to the actual information, also contains redundant information for purposes of identifying errors. Such information can be, for example, parity bits, which permit error detection through checksum operations, such as horizontal sum and/or longitudinal sum operations (even parity check). Other linearly and/or cyclically executable test methods are known, which include the Hamming code, the BCH code (Bose, Chandhuri, Hocquenghem) and the Abramson code. Also numbering among these test methods is the cyclic redundancy check (CRC), where test bytes are generated block by block, precisely in accordance with the CRC method, from the data and/or programs, thus from the information to be erased and/or copied and/or to be read in, and are then processed or recorded with this information. In addition to error detection, some of these methods even provide for error correction.

SUMMARY OF THE INVENTION

In the present invention, the original sector of the backup-worthy data and/or programs is advantageously not erased in response to an erase command. Therefore, the programming code used for reprogramming is retained. Erased instead is that sector which normally would contain the copy of the backup-worthy data and/or programs, thus the backup. As a further benefit, this sector is used as an intermediate memory for the new data and/or programs, worthy of backup, that do not need to be executable there. In this context, backup-worthy data and/or programs are understood to be those whose loss or faulty nature would no longer permit the memory to be reprogrammed or the memory contents to be later modified, or no longer allow the computer system to be used for its intended purpose, for example to control operational sequences in a vehicle.

Thus, the part of the data stream intended for the backup-worthy sector is advantageously redirected during programming into that data memory sector, which is used as an intermediate memory and which had been erased beforehand for this purpose.

An optimized small routine (RAM routine RR), located in the working memory, is then used to copy the new sector from the intermediate memory over to the old, previously undeleted sector. Last of all, the intermediate memory is erased, for example, by the RAM routine RR or by a program of the new backup-worthy data and/or programs. As a result, other data and/or programs can finally be written into the memory area used as the intermediate memory.

Therefore, to delete the sector which initiates the process, the method advantageously requires only one single erase command. The erase command is not dependent on whether backup-worthy data are contained in the sector to be erased or not. Thus, the new program code or the new data are automatically programmed in one single step.

It is beneficial that the backup-worthy memory sector is available during the entire reprogramming time, i.e., the time, during which no executable programming code is present in the backup-worthy sector, is minimized, since the backup-worthy data and/or programs are always located in the corresponding memory area.

Another beneficial result derived here is that there is no need to store the extensive programming routines of the backup-worthy data and/or programs in the working memory. The small, optimized RAM routine located in the working memory merely copies the new, backup-worthy data and/or programs over the old ones. Therefore, a further benefit is that only one small working memory is needed, i.e., little working memory capacity is loaded. If an abnormal termination occurs during RAM routine activity, then a boot block having a fixed configuration, can complete this operation using its own copying routine. This advantageously minimizes the size of the programming code, which is executed in the event of an abnormal termination.

Also advantageous is the fact that the boot block, which is able to have a fixed configuration in a non-erasable or non-writable memory sector, and does not decide which memory area is executed with old or new data and/or programs, but rather, if indicated, copies the new programming code over the old original and executes this again in the original sector. As a result, the routines or programs of the backup-worthy data and/or programs are located at all times in the original memory sectors intended for them in the first place. This minimizes the potential for errors. This procedure also eliminates the need for an executable backup. This means that, even in the case of an abnormal termination of the programming, there is advantageously no need to backup the old data and/or programs. The existing new data and/or programs can be copied, instead, from the boot block into the target sector, thus into the original sector.

DETAILED DESCRIPTION

Figure 1:
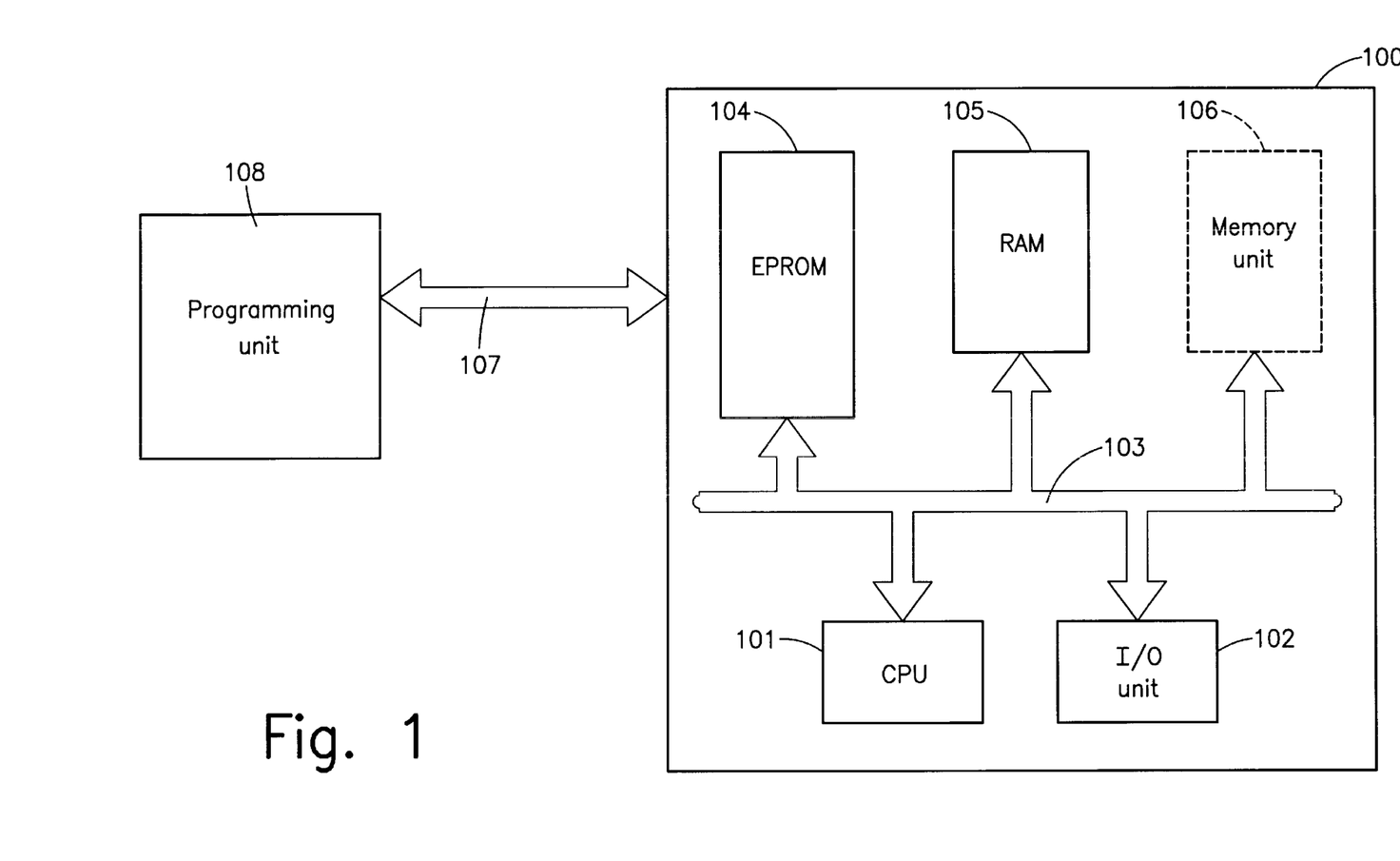
FIG. 1 depicts a hardware configuration that can be used in accordance with the present invention.

FIG. 1 depicts, by way of example, a hardware configuration for implementing the methods introduced here. 100 denotes a computer system, in particular a control unit. Contained therein are various memories, designated by 104, 105, and, optionally, 106. In this context, 104 represents an erasable, non-volatile memory, for example a flash EPROM memory, which has the capability of erasing and programming the memory contents on a sector-by-sector or block-by-block basis. Moreover, there is a volatile memory 105, for example, in the form of a RAM, which is used, inter alia, as a second memory for temporarily storing ("buffer storing")data and/or programs. Stored in this memory, in this exemplary embodiment, is the copying program, or the optimized RAM routine RR. Thus, programming routines can likewise be initiated from RAM 105. Provision can optionally be made for an additional non-volatile memory 106. These memories 104, 105 and, optionally, 106 are linked via a bus system 103, inter alia, to a CPU 101 and an input-output unit 102. In this context, memory 106 can also be provided as an external supplementary memory, outside of a system-internal microcomputer, or also outside of the computer system. In addition, the computer system, in particular a control unit, can contain other components, not depicted here, such as other CPUs and memories, various input-output units, etc. Via an input and output interface 107, for example of the serial or parallel type, computer system 100 is linked to an external control or programming unit 108. This external programming unit 108, which can also be a conventional computer, is used to input data and/or programs, for example to program a new program and/or data version. Also conceivable at this point are other input media, which are directly linked, for example, to the other input-output units.

Figure 2:
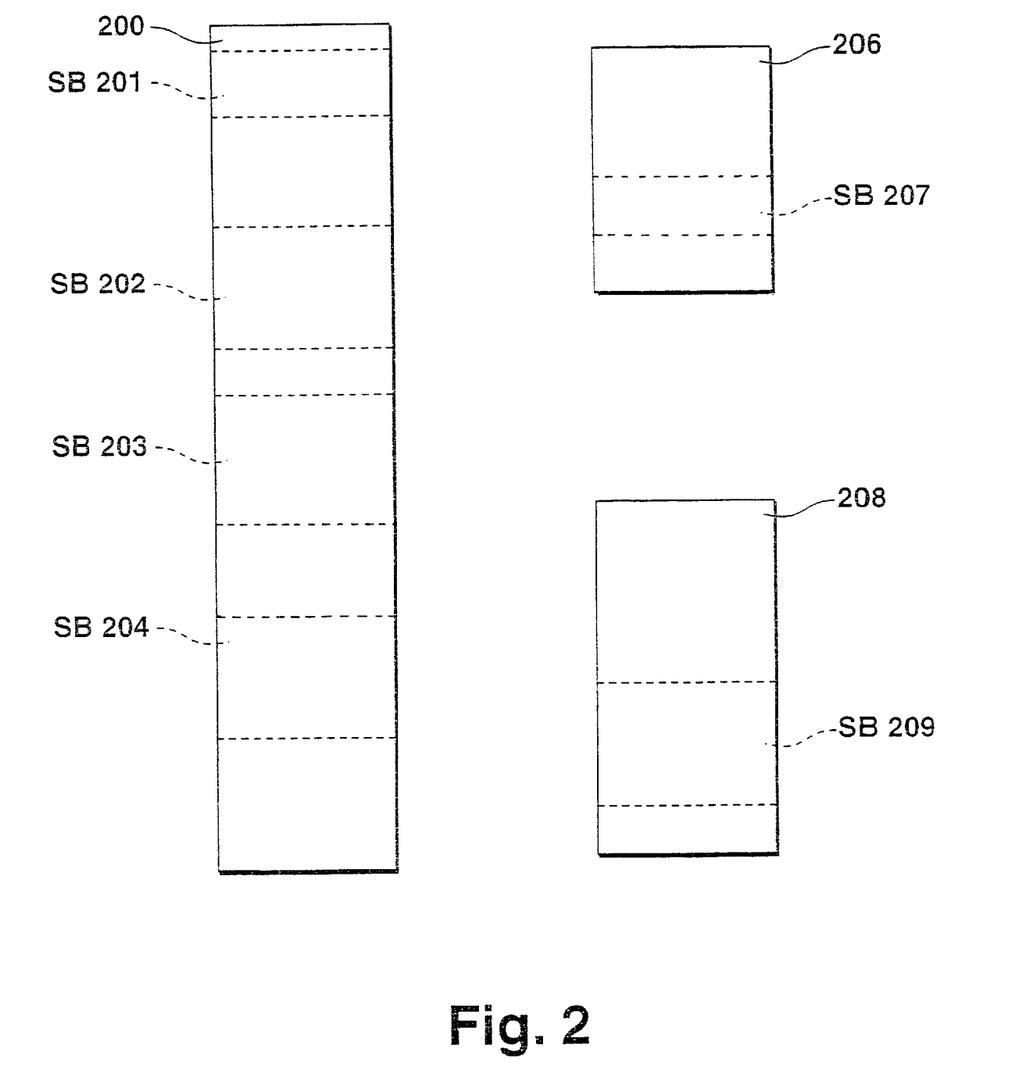
FIG. 2 illustrates one possible partitioning of the memory into individual memory sectors.

FIG. 2 depicts the afore-mentioned memories, partitioned into memory sectors. In this context, 200 symbolically represents the entire flash EPROM memory 104. It contains, inter alia, a memory sector SB 201, which represents the corresponding programming environment in the form of the boot block, thus, inter alia, of the computer system's start programs. Memory sector SB 201 for boot block BB can be configured to be neither readable nor writable, since there is no need to modify the boot block. The start programs are executed in a normal system start-up, in the same way as following a reset due to a power failure or some other cause. Memory sector SB 202 represents a program area for first programs P1. There is a further memory sector SB 203, which is a data sector containing additional data D at the end of a programming operation. Furthermore, memory sector SB 204 represents that sector in which data and/or programs are stored, which are worthy of backup or which contain backup-worthy data and/or programs. For the sake of clarity, the data stored in SB 204 are generally designated as backup-worthy data and/or programs SDP. This sector SB 204 is situated, for example, within the memory sector where the driving software is stored, particularly when the method and device presented here are used for controlling operational sequences in a vehicle. Thus, memory sector SB 204 is the original sector of the SDP. The specific routines required for flash programming contained, inter alia, in the backup-worthy data and/or programs, should be available during the entire time of modifications and/or programming. Furthermore, the backup-worthy data and/or programs SDB should be able to be reprogrammed, thus modified, so that there will be no need for upward compatibility of the interfaces between, for example, driving programs and the SDP. The scope of the memory sectors in the graphic illustration is arbitrary and provides no indication of the actual size, since this can vary depending on the field of application and use. Thus, memory sectors SB 201 through SB 204 can fill up the entire, symbolically depicted flash memory 200. An autonomous programming environment can be defined by the backup-worthy data and/or programs SDP able to be stored in memory sector 204. As mentioned, memory sector SB 204 corresponds to the original sector for the SDP. Thus, in the symbolically depicted flash memory 200, a separate, continually reserved backup sector is not provided, neither for programs, nor for data, and particularly not for the backup-worthy data and/or programs SDP.

Optionally, as shown in FIG. 1, is the use of a further memory element, in particular of a flash EPROM memory. This optional, additional memory 106 is symbolically depicted by block 208. Memory sector 209 can be provided therein as a sector for additional programs and/or data. In the described example, two programs P2 are stored in this sector. This can occur, for example, when the memory sector for first programs P1 does not suffice for the particular programming code, made up of P1 and P2. On the other hand, it is also conceivable, through programs PI, to implement specific standard and/or basic functions of the application in question and to represent other variations, such as special specific embodiments, special equipment, for example in motor vehicles, as well as special functions through programs P2 in memory sector SB 209.

The working memory or RAM memory 105 of FIG. 1 is symbolically depicted by block 206. Contained therein is memory sector 207, i.e., the section for the optimized RAM routine RR, which can also be loaded through any desired program sectors, such as boot block BB, program sectors P1 or P2, as well as through the backup-worthy data and/or programs SDP, into the working memory. This is dependent upon the sector in which the requisite functionality, such as a copying function for the transfer, is localized. The copying function, which executes the transfer of RAM routine RR into working memory 206 or memory sector 207, knows of the beginning and end address of RAM routine RR and, moreover, the target address in the RAM. This copying function is, for example, a program loop, in which a source and a destination pointer, are incremented, beginning with the particular start addresses, until the end address of the source of the copying operation is reached. For every address that is enabled, a data transfer can then be executed.

RAM routine RR is located, for example, in the area of backup-worthy data and/or programs SDP and/or in boot block BB. RAM routine RR is copied, for example, from executable program in SDP into working memory 206, and executed there. Following a copying operation by RR interrupted for any reason, this routine RR can be loaded from boot block BB into working memory 206, and be executed there.

Boot block BB is located either in a user-inaccessible or write-protected sector of flash memory 104 or 200, or can be localized in CPU 101 itself. As just explained, the optimized RAM routine RR can be advantageously copied by boot block BB, for example following a system crash or some other abnormal termination, into the working memory.

The programs and/or program loops and/or routines are advantageously implemented in the method as software code in a memory. However, it is likewise conceivable for the memory-software combination to be implemented as hard-wired logic.

Figure 3:
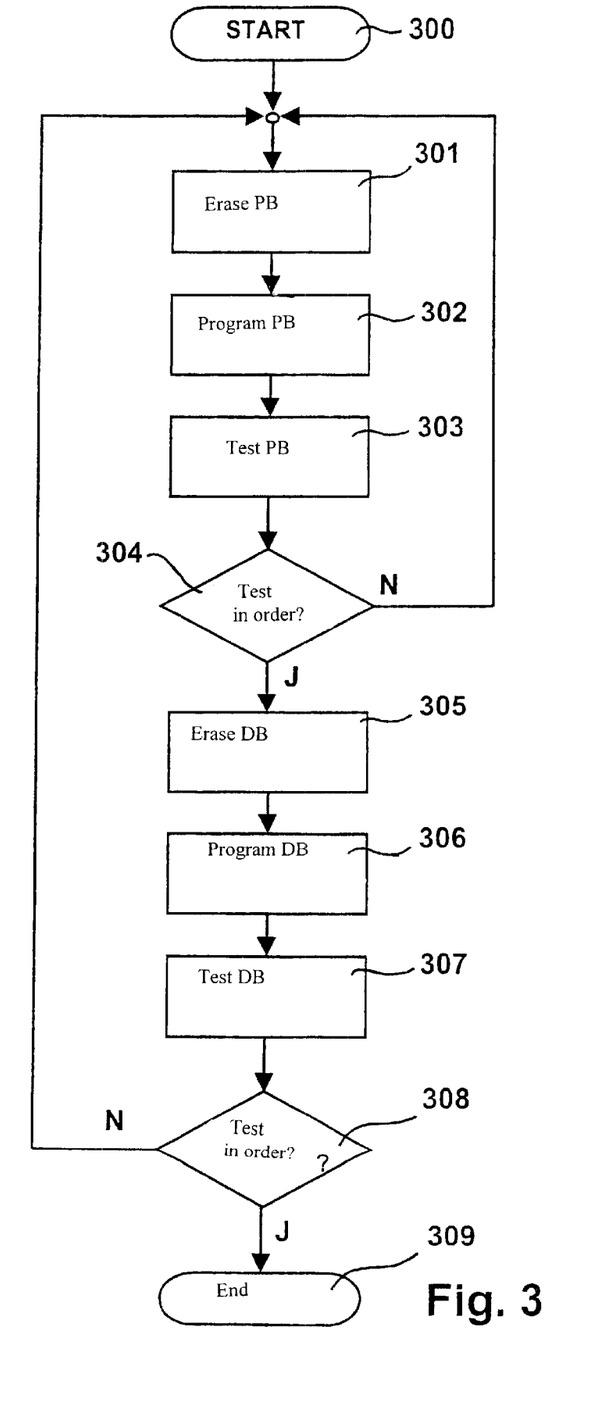
FIG. 3 describes, in a flow chart, a method for modifying and/or programming programs and/or data.
Figure 4:
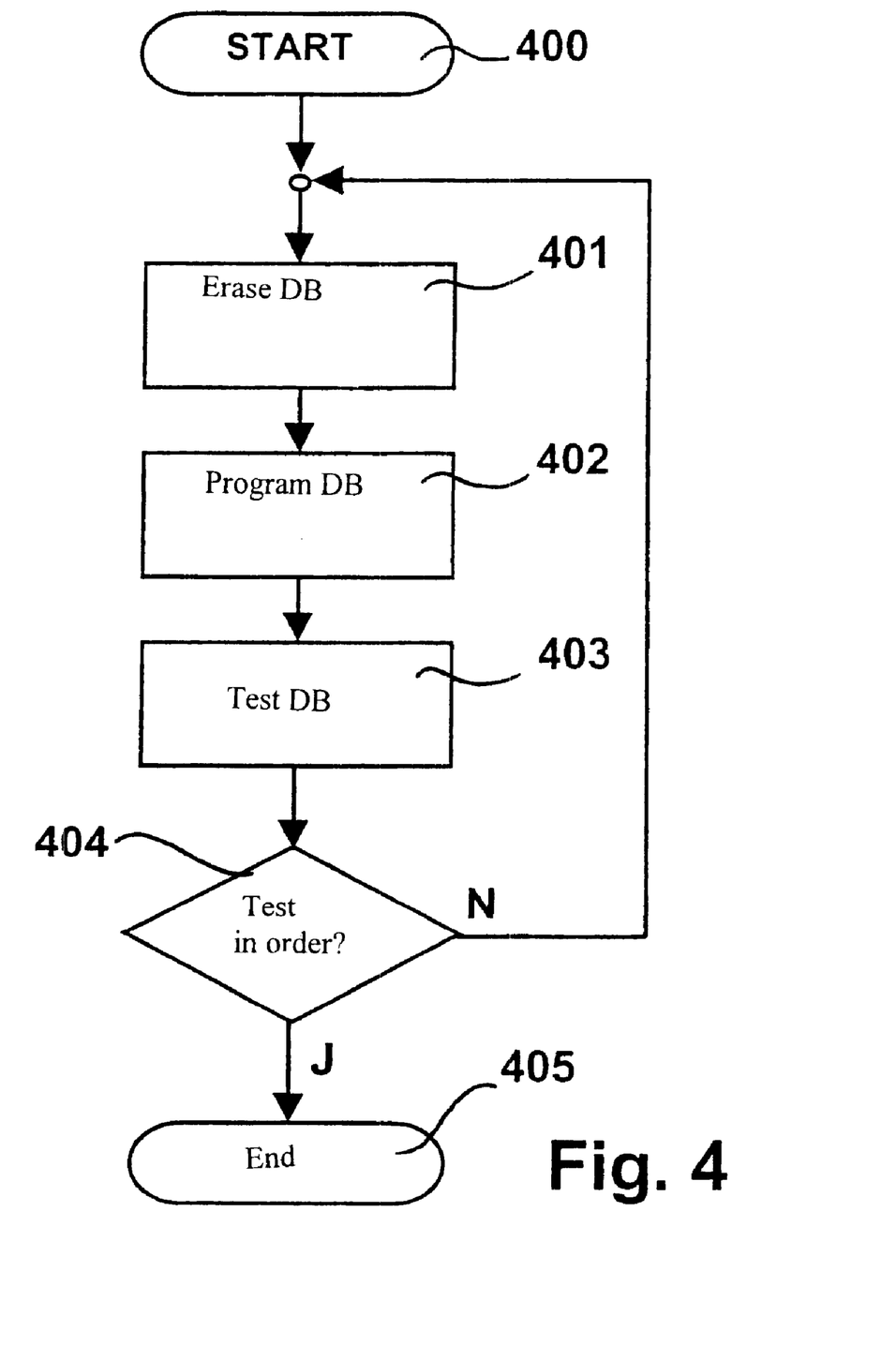
FIG. 4 shows the modification and/or programming of additional data.

The procedural concept depicted in flow charts in FIGS. 3 and 4, in conjunction with the memory sectors just referred to, provides that the original sector containing the backup-worthy data and/or programs SDP, thus memory sector SB 204, not be erased when an erase command is received for entire memory 104 or for parts of memory 104 or 200. As a result, the programming code is initially retained in the SDP sector, thus in SB 204. Instead, that sector, thus SB 203, is erased which normally would contain the backup or, in our case, the data sector for data D which are unworthy of backup.

In the subsequent programming, the part of the data stream, thus SDP, intended for the backup-worthy sector SB 204, is redirected into the previously erased sector SB 203. The backup-worthy data and/or programs SDP are not to be executable in SB 203. This makes it possible to use SDP programs and/or data of any origin, with the sole stipulation that they be configured to be executable in SB 204.

Through an optimized small routine RR located in the RAM memory in sector SB 207, the contents of SB 203, thus the redirected, new backup-worthy data and/or programs SDPnew, is subsequently copied over the old SDPold located in the sector SB 204, and memory sector SB 203 is subsequently erased. Thus, memory sector SB 203 is used merely as an intermediate memory for the new backup-worthy data and/or programs SDPnew.

If an abnormal termination occurs during RAM routine RR activity, then a boot block BB having a fixed configuration in memory sector SB 201 can complete the operation using its own copying routine. This copying routine is comparable to RAM routine RR.

FIGS. 3 and 4 provide an overview of the process sequence. In this context, programs and data are first programmed in FIG. 3. Programming sector PB includes programs P1, which program backup-worthy data and/or programs SDP, as well as, optionally, programs P2. P1, SDP and, optionally, P2 are programmed within the framework of a program-programming session that can follow the program-programming session. The remaining data sector DB is likewise automatically programmed within the framework of a data-programming session. Boot block BB is, for example, designed to be neither erasable nor programmable and is, therefore, permanently present. The method sequence starts in block 300, for example by inputting an erase command from an external programming device for a specific memory sector or for the entire flash memory. When boot block BB has an fixed design and is contained neither in the flash memory nor, for example, in the CPU, then this is, of course, retained.

Program sector PB is initially erased in block 301. In the process, as already mentioned, sector SB 204 having SDPold is not erased. Thus, the now existing programs P1old in SB 202 and, optionally, P2old in SB 209 are deleted. Data D in the form of Dold can now likewise be erased, because, in this specific embodiment, the program and data-sector programming is followed by a data programming. Thus, in block 301, Dold in memory sector SB 203 is likewise erased. The point of departure was, therefore, the sending of a single erase command for the entire sector to be erased, in particular, the entire flash memory 200. This is independent of whether the sector to be erased or to be programmed is a simply cohesive sector, or whether the sector to be erased or to be programmed contains backup-worthy subsectors requiring special handling.

Following the erasing, one arrives at block 302. In this block, program sector PB is now programmed. In the process, the new programs P1new and, optionally, P2new are written into the memory sectors SB 202 and SB 209, respectively. The new backup-worthy data and/or programs SDPnew are not written into SB 204, but rather redirected into the erased data sector SB 203, so that the execution can continue to be controlled from SDPold in SB 204.

Once program sector PB is programmed, as described, one arrives at block 303, in which program sector PB is checked. In this context, various methods, as already named in the related art, can be used for the test procedure. Thus, P1new is tested in SB 202, optionally P2new in SB 209, and finally SDPnew in data sector SB 203, using the backup-worthy data and/or programs SDPold still stored in SB 204, before SDPnew assumes the sequencing control following the recopying into SB 204.

In query 304, it is checked whether errors have occurred during the test procedure. If this is the case, one arrives again at block 301, and program sector PB is again erased. This functional sequence is still controlled by SDPold. If no errors occur during the tests, or if any occurring errors were able to be corrected, then one arrives at block 305.

In this respect, data sector DB is now erased. In block 305, RAM routine RR is initially copied into RAM sector SB 207. This routine RR can be contained, for example, in SDPold in SB 204, or be formed by copying sections of SDPold into RAM 206. At this point, RAM routine RR in SB 207 deletes the backup-worthy data and/or programs SDPold in SB 204. The new, just tested, backup-worthy data and/or programs SDPnew are then likewise copied by RAM routine RR out of data sector SB 203 into sector SB 204. SDPnew in memory sector SB 203 is subsequently erased. Thus, in block 305, the sequencing control is quasi still at SDPold, from where the RAM routine RR is formed or relocated. One then arrives at block 306.

Data sector DB is programmed in this manner. The new data Dnew are written into SB 203, from where SDPnew was previously copied by SDPold into SB 204. Thus, in this block, the sequencing control is assumed by SDPnew in memory sector SB 204.

At this point, in the following block 307, data sector DB, in other words data Dnew in memory sector SB 203, is checked. This can be achieved by the measures named in the related art, in the same way as the program sector. If the test results are in order, thus if no errors occur, or if any existing errors are corrected, one arrives at block 309 at the end of the sequence. If uncorrected or uncorrectable errors occurred, then query 308 reveals that the data sector was not properly programmed, and one arrives again at block 301, and the sequence begins anew.

Consequently, SDPold in SB 204 is not erased until SDPnew in SB 203 is successfully checked. This gives one the guarantee that, even in the event that programming is abnormally terminated or in the case of manipulation attempts, a tested variant of the backup-worthy data and/or programs SDP is always available in the control unit, thereby assuring permanent reprogramming capability.

In the illustrated sequence, the programming code of SDP is always executed from memory sector SB 204, and not from its possible backup sector, data sector SB 203. This principle significantly improves operational reliability with comparatively little outlay for program development. Thus, the method is relatively simple and merely requires that the programming, for example, of a driving program in a vehicle, be followed by a subsequent command or a delay in the final programming command, it being possible, during its execution, to copy the new program sections into the target sector, in other words the original sector. This is generally applicable.

It is beneficial that the partitioning of memory is unknown to potential programming devices. They transmit one erase command to program sector PB and/or to data sector DB. The redirecting of SDP and the copying over from temporary sector SB 203 into the actual destination sector SB 204 is coupled, for example, to the erase operations and is, therefore, not visible to potential programming devices. To modify and/or write in data and/or programs, the programming devices can be arranged externally with respect to the control unit containing the memories, as, for example, programming unit 108 in FIG. 1, or, however, be completely or partially integrated. Thus, the programming devices can be localized externally and/or internally with respect to the control unit containing the memory sectors to be programmed. In this case, a separation into hardware or software, which constitute the arrangement, is not practical. Thus, the arrangement can be implemented or mapped as hardware and/or as software. Thus, a combination can be implemented from a memory or memory sector and from data and/or programs localized therein, as a sequencing instruction, in the same way as hardwired logic. The programming is able to be initiated and then automatically executed, as described, in response to an erase command. The programming operation can, thus, also be performed by CPU 101 of the control unit itself. Thus, in accordance with the above explanations, a first arrangement can also be an external programming unit 108, as a hardware and software composite, as a combination of CPU 101 of control unit 100, of a memory sector SB 204 of non-volatile memory 200, and of the data and/or programs SDP (SDPold or SDPnew) assigned to this memory sector, or comparable combinations. Thus, in addition, the arrangement include an execution unit, such as CPU 101 or the processor present in programming unit 108. Thus, RAM routine RR, as a copying program, written into volatile memory 206, or its memory sector SB 207, can represent a further, second arrangement. Other arrangements are, thus, memory sector SB 201 including boot block BB and RAM routine RR likewise localized therein for the case of an abnormal termination, memory sector SB 202 including programs P1, or memory sector SB 209 including programs P2. FIG. 4 depicts the case where the intention is to program only data sector SB 203 for data D. Here as well, an assigned command starts the execution of the sequence. This can be, in turn, an erase command, it being evident that the intention is for only the data sector to be programmed. Data sector SB 203 is subsequently erased in block 401. Data sector SB 203 is then programmed in block 402. Data Dnew are, therefore, then written into SB 203. At this point, the programmed data are checked in block 403, as in the preceding example. If, in this context, errors are recognized, as previously, through query 404, then one arrives again at block 401. If the results of the test are in order, then one arrives at block 405, the end of the sequence. Thus, a simple, pure data programming or modification is still easily possible.

What is claimed is:

1. A method for performing at least one of a modification and a writing in at least one of data and programs in at least one non-volatile memory of a computer system comprising the steps of:

dividing the at least one of data and programs into an old first set of the at least one of data and programs and an old second set of the at least one of data and programs, wherein the old second set of the at least one of data and programs is worthy of being backed up;

writing the old second set of the at least one of data and programs to an assigned original sector of the non-volatile memory;

writing a copying program into a volatile memory, the copying program being able to copy a new second set of the at least one of data and programs from a second memory sector of the non-volatile memory into the assigned original sector;

erasing the old second set of the at least one of data and programs written to the assigned original sector of the non-volatile memory only after the new second set of the at least one of data and programs is written to the second memory sector; and after the erasing, copying the new second set of the at least one of data and programs from the second memory sector to the assigned original sector.

2. The method of claim 1, wherein:

the at least one of data and programs corresponds to at least one of data and programs for controlling operational sequences in a vehicle.

3. The method of claim 1, wherein:

the at least one non-volatile memory corresponds to a memory of a control unit in the vehicle.

4. The method of claim 1, further comprising the step of:

executing the second set of the at least one of data and programs only in the assigned original sector.

5. The method of claim 1, further comprising the steps of:

containing the copying program in the second set of the at least one of data and programs; and loading the copying program into the volatile memory via the second set of at least one of data and programs.

6. The method of claim 1, further comprising the steps of:

containing the copying program in a third set of the at least one of data and programs that is able to perform a start procedure for the computer system; and loading the copying program into the volatile memory via the third set of the at least one of data and programs.

7. The method of claim 6, further comprising the step of: executing the second set of the at least one of data and programs only in the assigned original sector.

8. A method for performing at least one of a modification and a writing in at least one of data and programs in at least one non-volatile memory of a computer system, comprising the steps of:

erasing an old set of the at least one of data and programs already contained in the at least one non-volatile memory in a memory sector before a new set of the at least one of data and programs is at least one of modified and written;

erasing the old set of the at least one of data and programs without creating a backup copy of the old set of the at least one of data and programs; and after the old set of the at least one of data and programs is erased, executing a copying program that is written into a volatile memory to write the new set of the at least one of data and programs into the memory sector without creating a back up copy of the old set of the at least one of data and programs.

9. The method of claim 8, wherein:

the at least one of data and programs corresponds to at least one of data and programs for controlling operational sequences in a vehicle.

10. The method of claim 8, wherein:

the at least one non-volatile memory corresponds to a memory of a control unit in the vehicle.

11. A method for performing at least one of a modification and a writing in at least one of data and programs in at least one non-volatile memory of a computer system, comprising the steps of:

dividing the at least one of data and programs into an old first set of the at least one of data and programs and an old second set of the at least one of data and programs, wherein the old second set of the at least one of data and programs is worthy of being backed up;

writing the old first set of the at least one of data and programs to a first sector of the non-volatile memory;

writing the old second set of the at least one of data and programs to an assigned original sector of the non-volatile memory; and erasing only the old first set of the at least one of data and programs by an initial erase command before a new set of the at least one of data and programs is written to the non-volatile memory, the initial erase command requesting erasure of portions of the memory including the old first set of the at least one of data and programs and the old second set of the at least one of data and programs.

12. The method of claim 11, wherein:

the at least one of data and programs corresponds to at least one of data and programs for controlling operational sequences in a vehicle.

13. The method of claim 11, wherein:

the at least one non-volatile memory corresponds to a memory of a control unit in the vehicle.

14. A device, comprising:

a non-volatile memory;

at least one volatile memory;

a first arrangement for performing one of a modification on at least one of data and programs and a writing of the at least one of data and programs into the non-volatile memory, wherein the first arrangement erases an old set of the at least one of data and programs contained in the non-volatile memory in an assigned original sector before a new set of the at least one of data and programs is at least one of modified and written, the at least one of data and programs being divided into a first set of the at least one of data and programs and a second set of the at least one of data and programs, at least the second set of data being worthy of backup; and a second arrangement including the at least one volatile memory, wherein the first arrangement avoids erasing an old second set of the at least one of data and programs in the assigned original sector of the non-volatile memory until the first arrangement has written a new second set of the at least one of data and programs into a second memory sector of the non-volatile memory that differs from the assigned original sector, and wherein after the erasing, the second arrangement copies the new second set of the at least one of data and programs from the second memory sector of the non-volatile memory into the assigned original sector.

15. The device of claim 14, wherein:

the device is arranged in a vehicle.

16. A devices comprising:

at least one non-volatile memory;

at least one volatile memory;

a first arrangement for performing at least one of a modification on at least one of data and programs and a writing of the at least one of data and programs into the at least one non-volatile memory, wherein:

the at least one of data and programs in the at least one non-volatile memory is divided into a first set of the at least one of data and programs and a second set of the at least one of data and programs, the second set of the at least one of data and programs being backup-worthy, the first arrangement, in accordance with an erase command, erases only the first set of the at least one of data and programs and retains the second set of the at least one of data and programs, the erase command requesting an erasure of a portion of the at least one non-volatile memory including both the first set of the at least one of data and programs, and the second set of the at least one of data and programs; and a second arrangement for performing one of a modification and a writing of the at least one of data and programs following the erase command, the second arrangement including an old second set of the least one of data and programs and the assigned memory sector.

17. The device of claim 16, wherein:

the device is arranged in a vehicle.

18. The device of claim 16, wherein:

the at least one of data and programs corresponds to at least one of data and programs for controlling operational sequences in a vehicle.

\* \* \* \* \*

UNITED STATES PATENT AND TRADEMARK OFFICE
CERTIFICATE OF CORRECTION

PATENT NO.     : 6,546,455 B1
DATED          : April 8, 2003
INVENTOR(S)    : Martin Hurich et al.

It is certified that error appears in the above-identified patent and that said Letters Patent is hereby corrected as shown below:

<u>Title page, Item [54] and Column 1, line 1,</u>
Title, change to read -- METHOD AND DEVICE FOR MODIFYING THE MEMORY CONTENTS OF AND REPROGRAMMING A MEMORY --.

<u>Column 10,</u>
Line 30, change "devices" to -- device, --.

Signed and Sealed this

Second Day of March, 2004

JON W. DUDAS
*Acting Director of the United States Patent and Trademark Office*